(12) United States Patent
Ho et al.

(10) Patent No.: US 8,395,209 B1
(45) Date of Patent: Mar. 12, 2013

(54) SINGLE-SIDED ACCESS DEVICE AND FABRICATION METHOD THEREOF

(75) Inventors: Hsin-Jung Ho, New Taipei (TW);
Jeng-Ping Lin, Taoyuan County (TW);
Neng-Tai Shih, Taipei (TW);
Chang-Rong Wu, New Taipei (TW);
Chiang-Hung Lin, New Taipei (TW);
Chih-Huang Wu, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 57 days.

(21) Appl. No.: 13/239,389

(22) Filed: Sep. 22, 2011

(51) Int. Cl.
*H01L 29/66* (2006.01)
(52) U.S. Cl. .................... 257/330; 257/331; 257/334
(58) Field of Classification Search .............. 257/330, 257/506, 347, 365, 334, 401, 331, E29.255, 257/E29.166
See application file for complete search history.

(56) References Cited

U.S. PATENT DOCUMENTS

| | | | |
|---|---|---|---|
| 6,413,802 B1 * | 7/2002 | Hu et al. | 438/151 |
| 7,221,032 B2 * | 5/2007 | Kondo | 257/401 |
| 2008/0035991 A1 * | 2/2008 | Lee et al. | 257/331 |

* cited by examiner

*Primary Examiner* — N Drew Richards
*Assistant Examiner* — Christina Sylvia
(74) *Attorney, Agent, or Firm* — Winston Hsu; Scott Margo

(57) ABSTRACT

A single-sided access device includes an active fin structure comprising a source contact area and a drain contact area separated from each other by an isolation region therebetween; a trench isolation structure disposed at one side of the active fin structure, wherein the trench isolation structure intersects with the isolation region between the source contact area and the drain contact area; a sidewall gate disposed under the isolation region and on the other side of the active fin structure opposite to the trench isolation structure so that the active fin structure is sandwiched by the trench isolation structure and the sidewall gate, wherein the sidewall gate has multi-fingers that engage with the active fin structure; and a gate dielectric layer between the sidewall gate and the active fin structure.

7 Claims, 11 Drawing Sheets

SINGLE-SIDED ACCESS DEVICE AND FABRICATION METHOD THEREOF

BACKGROUND OF THE INVENTION

1. Field of the Invention

The present invention relates to a single-sided access device for DRAM applications. More particularly, the present invention relates to a single-sided multi-finger gate fin field-effect-transistor (FinFET) or single-gate FinFET with improved device control and access drive current, and a method for making the same.

2. Description of the Prior Art

As known in the art, dynamic random access memory (DRAM) is a type of random access memory that stores each bit of data in a separate capacitor within an integrated circuit. Typically, DRAM is arranged in a square array of one capacitor and transistor per cell. The transistor, which acts as switching device, comprises a gate and a silicon channel region underneath the gate. The silicon channel region is located between a pair of source/drain regions in a semiconductor substrate and the gate is configured to electrically connect the source/drain regions to one another through the silicon channel region.

A vertical double-gate fin field-effect-transistor (FinFET) has been developed for the next-generation $4F^2$ DRAM cell (F stands for minimum lithographic feature width). However, difficulties are frequently encountered in attempting to produce the vast arrays of vertical double-gate FinFET devices desired for semiconductor DRAM applications while maintaining suitable performance characteristics of the devices. For example, recently DRAM manufacturers face a tremendous challenge on shrinking the memory cell area as the word line spacing, i.e., the spacing between two adjacent word lines, continues to shrink. For high-speed DRAM applications, electrical coupling effect may be a problem as the spacing between two closely arranged word lines continues to shrink. Further, it is desired to provide an improved FinFET access device with higher gate current and therefore better device performance.

In light of the above, there is a strong need in this industry to provide a novel FinFET structure and the fabrication process thereof in order to avoid the aforesaid problems.

SUMMARY OF THE INVENTION

To address these and other objects and in view of its purposes, the present invention provides a single-sided access device including an active fin structure comprising a source contact area and a drain contact area separated from each other by an isolation region therebetween; a trench isolation structure disposed at one side of the active fin structure, wherein the trench isolation structure intersects with the isolation region between the source contact area and the drain contact area; a sidewall gate disposed under the isolation region and on the other side of the active fin structure opposite to the trench isolation structure so that the active fin structure is sandwiched by the trench isolation structure and the sidewall gate, wherein the sidewall gate has multi-fingers that engage with the active fin structure; and a gate dielectric layer between the sidewall gate and the active fin structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIGS. 1A-1C are different views of the semiconductor substrate after the first shallow trench isolation (STI) process, wherein FIG. 1A is a schematic top view of the semiconductor substrate showing the line-shaped STI regions and the line-shaped active areas between the STI regions, FIG. 1B is a schematic, cross-sectional view taken alone line II-II' of FIG. 1A, and FIG. 1C is a schematic, cross-sectional view taken alone line I-I' of FIG. 1A;

FIGS. 2A-2C are different views of the semiconductor substrate after the deposition of polysilicon sacrificial layer and after the second STI process, wherein FIG. 2A is a schematic top view of the semiconductor substrate, FIG. 2B is a schematic, cross-sectional view taken alone line II-II' of FIG. 2A, and FIG. 2C is a schematic, cross-sectional view taken alone line I-I' of FIG. 2A;

FIGS. 3A-3C are different views of the semiconductor substrate after the STI recess process and SiN CMP, wherein FIG. 3A is a schematic top view of the semiconductor substrate, FIG. 3B is a schematic, cross-sectional view taken alone line II-II' of FIG. 3A, and FIG. 3C is a schematic, cross-sectional view taken alone line I-I' of FIG. 3A;

FIGS. 4A-4C are different views of the semiconductor substrate after the removal of the sacrificial layer, wherein FIG. 4A is a schematic top view of the semiconductor substrate, FIG. 4B is a schematic, cross-sectional view taken alone line II-II' of FIG. 4A, and FIG. 4C is a schematic, cross-sectional view taken alone line I-I' of FIG. 4A;

FIGS. 5A-5C are different views of the semiconductor substrate after the formation of the SiN spacer, wherein FIG. 5A is a schematic top view of the semiconductor substrate, FIG. 5B is a schematic, cross-sectional view taken alone line II-II' of FIG. 5A, and FIG. 5C is a schematic, cross-sectional view taken alone line I-I' of FIG. 5A;

FIGS. 6A-6C are different views of the semiconductor substrate after the formation of the trench and pull back of the line-shaped STI regions and the insulation region, wherein FIG. 6A is a schematic top view of the semiconductor substrate, FIG. 6B is a schematic, cross-sectional view taken alone line II-II' of FIG. 6A, and FIG. 6C is a schematic, cross-sectional view taken alone line I-I' of FIG. 6A;

FIGS. 7A-7C are different views of the semiconductor substrate after the formation of the gate dielectric layer and the spacer gate, wherein FIG. 7A is a schematic top view of the semiconductor substrate, FIG. 7B is a schematic, cross-sectional view taken alone line II-II' of FIG. 7A, and FIG. 7C is a schematic, cross-sectional view taken alone line I-I' of FIG. 7A;

FIGS. 8A-8C are different views of the semiconductor substrate after the first STI oxide fill process, wherein FIG. 8A is a schematic top view of the semiconductor substrate, FIG. 8B is a schematic, cross-sectional view taken alone line II-II' of FIG. 8A, and FIG. 8C is a schematic, cross-sectional view taken alone line I-I' of FIG. 8A;

FIGS. 9A-9C are different views of the semiconductor substrate after the spacer gate wet etching, wherein FIG. 9A is a schematic top view of the semiconductor substrate, FIG. 9B is a schematic, cross-sectional view taken alone line II-II' of FIG. 9A, and FIG. 9C is a schematic, cross-sectional view taken alone line I-I' of FIG. 9A;

FIGS. 10A-10C are different views of the semiconductor substrate after the second STI oxide fill process and removal of the self-aligned hard mask pattern, wherein FIG. 10A is a schematic top view of the semiconductor substrate, FIG. 10B is a schematic, cross-sectional view taken alone line II-II' of FIG. 10A, and FIG. 10C is a schematic, cross-sectional view taken alone line I-I' of FIG. 10A.

Figure 1A:
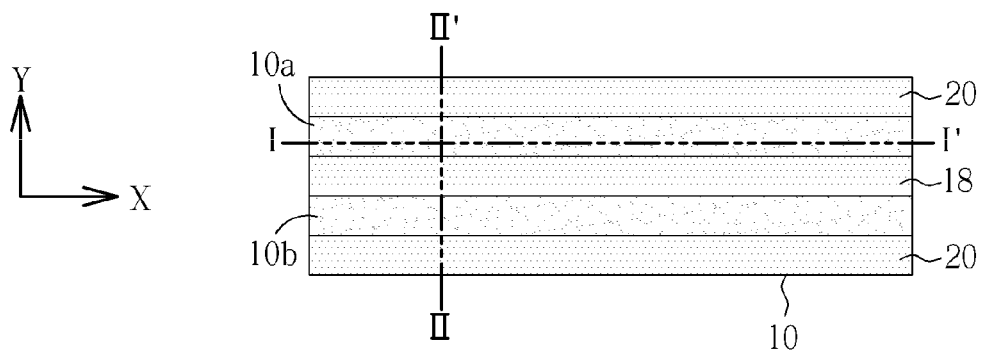

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. However, it will be apparent to one skilled in the art that the invention may be practiced without these specific details. In order to avoid obscuring the present invention, some well-known system configurations and process steps are not disclosed in detail.

Likewise, the drawings showing embodiments of the apparatus are semi-diagrammatic and not to scale and, particularly, some of the dimensions are for the clarity of presentation and are shown exaggerated in the figures. Also, in which multiple embodiments are disclosed and described having some features in common, for clarity and ease of illustration and description thereof, like or similar features will ordinarily be described with like reference numerals.

The term "horizontal" as used herein is defined as a plane parallel to the conventional major plane or primary surface of the semiconductor substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", if used, are defined with respect to the horizontal plane.

Figures 1B, 1C:
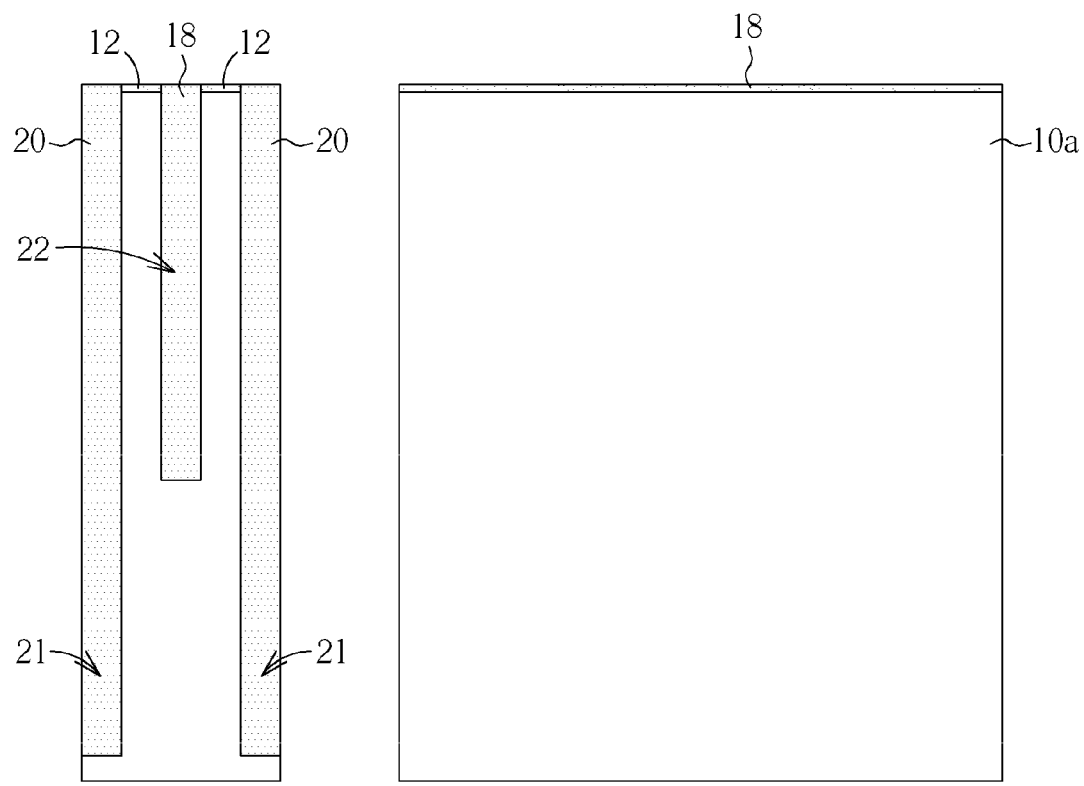

Referring to FIGS. 1A-1C, a semiconductor substrate 10 is provided. A pad layer 12 is formed on the main surface of the semiconductor substrate 10. The pad layer 12 may comprise silicon oxide or silicon nitride. The semiconductor substrate 10 as shown in the figures may be a portion of a DRAM array or a DRAM device, but should not be limiting. The semiconductor substrate may include, but not limited to, silicon substrate, silicon substrate with an epitaxial layer, SiGe substrate, silicon-on-insulator (SOI) substrate, gallium arsenide (GaAs) substrate, gallium arsenide-phosphide (GaAsP) substrate, indium phosphide (InP) substrate, gallium aluminum arsenic (GaAlAs) substrate, or indium gallium phosphide (InGaP) substrate. A shallow trench isolation (STI) process is then carried out to form line-shaped STI regions 20 embedded in the semiconductor substrate 10. The line-shaped STI regions 20 provide electrical isolation between two adjacent rows of devices and may have a depth of about 250 nm. According to the embodiment of the invention, each of the line-shaped STI regions 20 extends along the reference x-axis direction. The line-shaped STI regions 20 may be formed by spin-on-dielectric (SOD) gap-fill methods. Optionally, a lining layer (not shown) may be formed in the STI trench 21.

Subsequently, a line-shaped recessed trench 22 is formed in the semiconductor substrate 10 between two adjacent STI trenches 21. The recessed trench 22 also extends along the reference x-axis direction between two STI trenches 21 to thereby define two active areas 10a and 10b. The recessed trench 22 may have a depth of about 150 nm, which is shallower than the STI trenches 21. An insulation region 18 such as silicon oxide is then formed in the recessed trench 22. Thereafter, the entire surface of the semiconductor substrate 10 is subjected to polishing process such as chemical mechanical process. As specifically indicated in FIG. 1A and FIG. 1B, the width of each of the STI trenches 21, the width of the recessed trench 22 and the width of each of the active areas 10a and 10b may be substantially the same, for example, 15 nm.

Figure 2A:
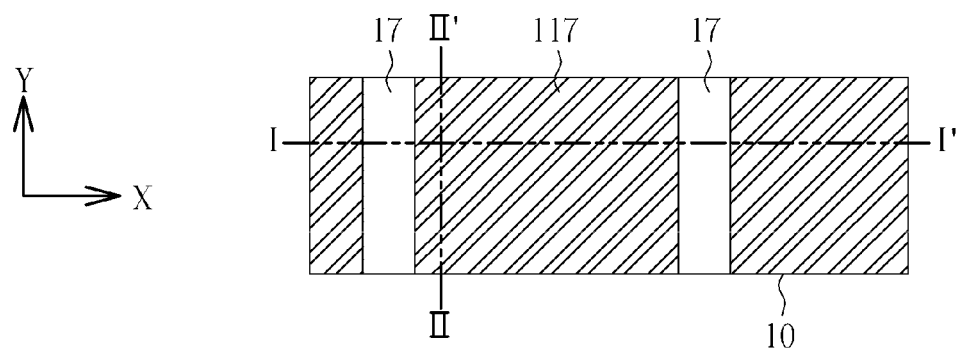
Figures 2B, 2C:
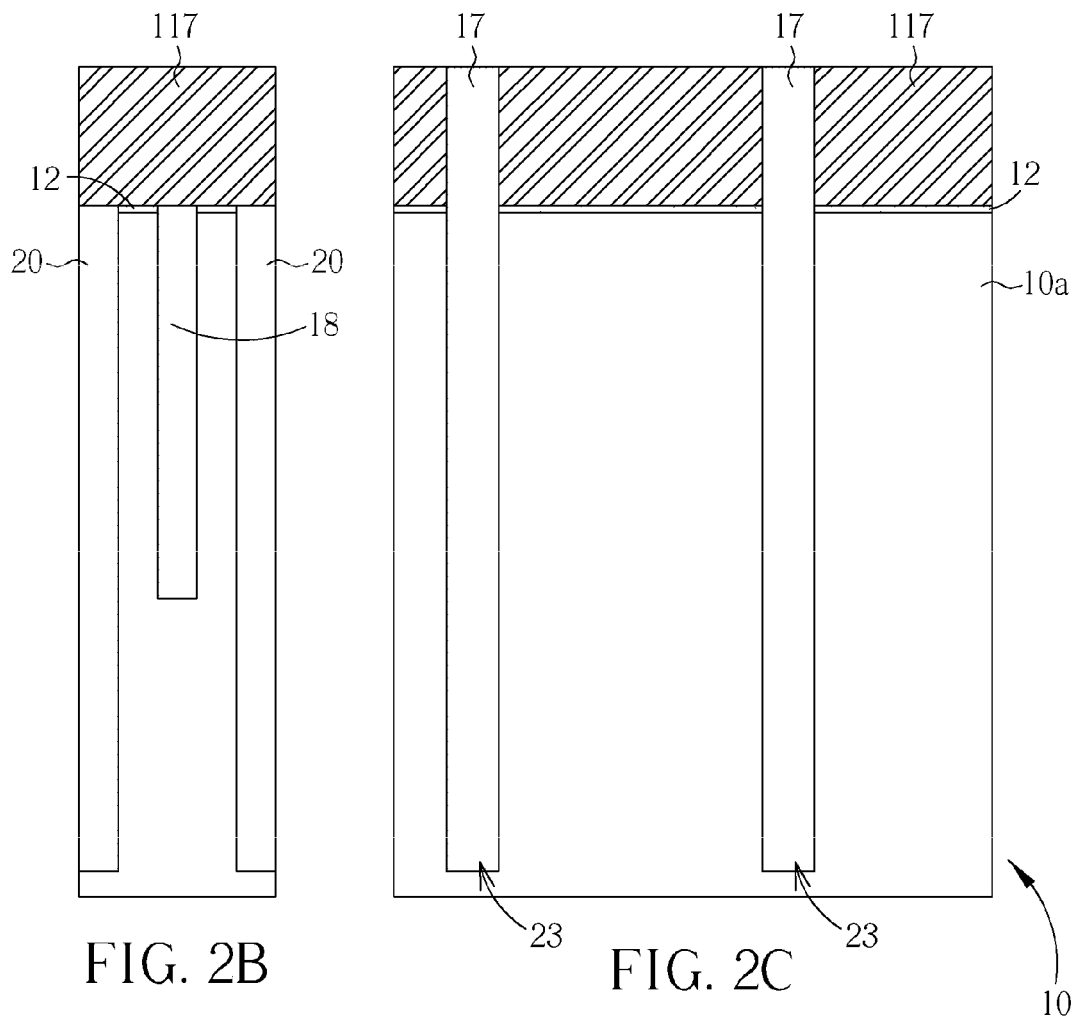

Referring now to FIGS. 2A-2C, subsequently, a sacrificial layer 117 may be formed on the planar surface of the semiconductor substrate 10. The sacrificial layer 117 may comprise silicon oxide layer, silicon nitride or polysilicon. According to the embodiment of this invention, the sacrificial layer 117 comprises polysilicon and may have a thickness of about 50 nm. A lithographic process and dry etching process are carried out to form line-shaped trenches 23 that extend along the reference y-axis direction. The line-shaped STI regions 20 and the insulation region 18 are intersected with the line-shaped trenches 23. According to the embodiment of the invention, the line-shaped trenches 23 may have a depth of about 250 nm and a width of about 20 nm. The space between two adjacent line-shaped trenches 23 may be about 100 nm, for example.

Thereafter, a lining layer (not shown) may be formed on the interior surface of the line-shaped trenches 23, including the sidewall and bottom surface of the line-shaped trenches 23. According to the embodiment of the invention, the lining layer may comprise silicon oxide, silicon nitride, composite of silicon oxide and silicon nitride, or any other materials. Subsequently, an SOD gap-filler (not shown) is coated on the semiconductor substrate 10 and fills up the line-shaped trenches 23. The SOD gap filler may comprise polysilazane precursor but not limited thereto. A curing or densification process may be carried out to transform the SOD gap filler into silicon oxide gap filler. For example, the curing process may be carried out at high temperatures (e.g. 800-1000° C.) with the presence of steam. A CMP process may be carried out to remove the excess silicon oxide gap filler outside the line-shaped trenches 23, thereby forming STI regions 17. At this point, the STI regions 17 are coplanar with the top surface of the sacrificial layer 117.

Figure 3A:
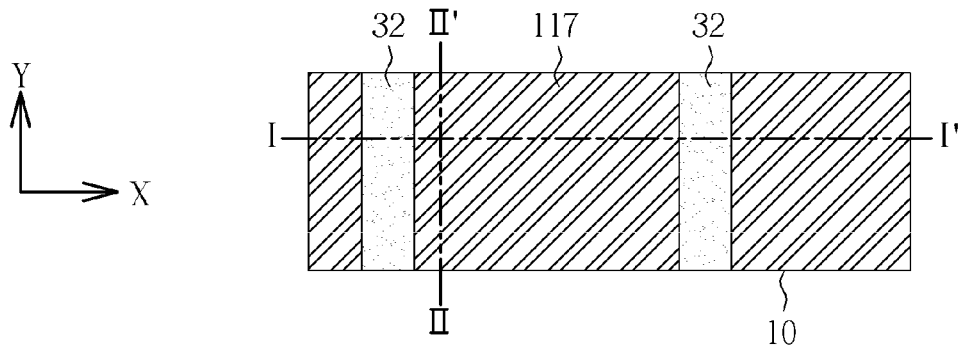
Figures 3B, 3C:
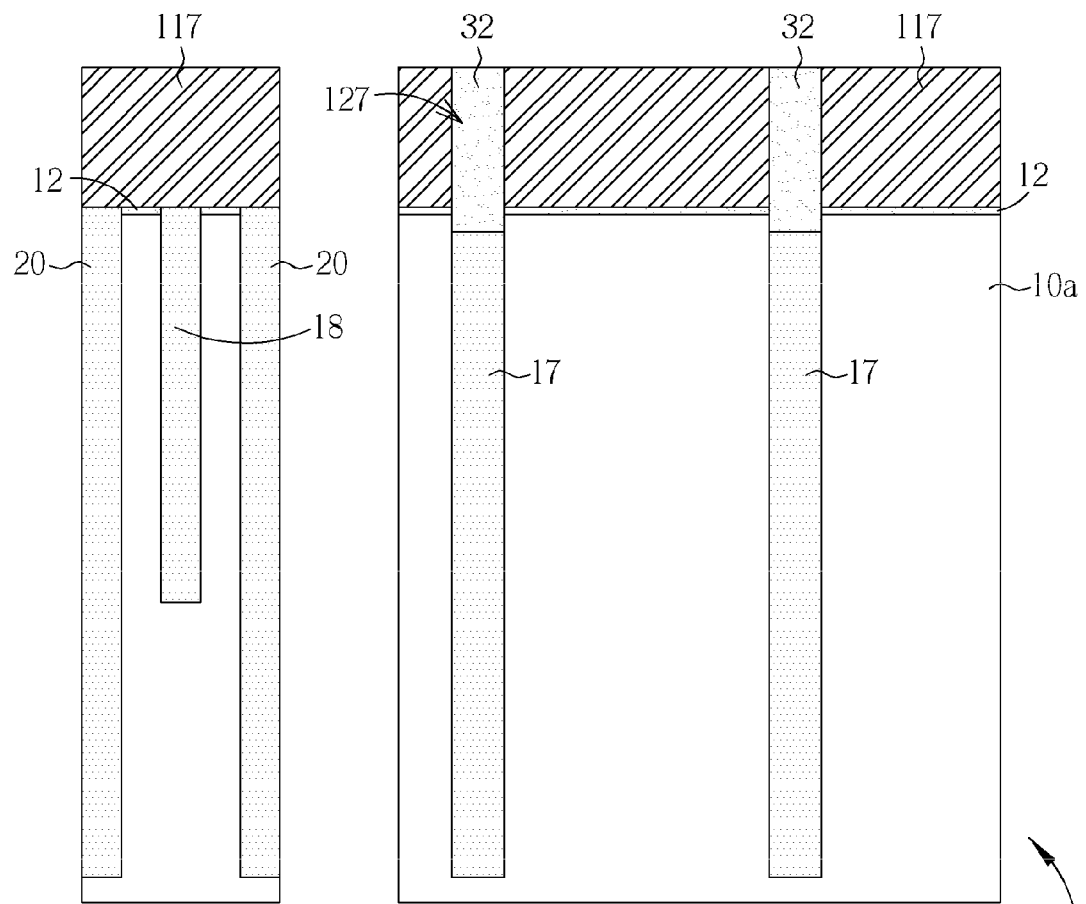

Referring to FIGS. 3A-3C, subsequently, an etching process is performed to selectively etch a top portion of each of the STI regions 17, thereby forming a recess 127 directly above each of the STI regions 17. According to the embodiment of the invention, the depth of the recess 127 may be about 60 nm. After the formation of the recess 127, a chemical vapor deposition (CVD) process is performed to deposit a silicon nitride film 32 into the recess 127. The silicon nitride film 32 fills up the recess 127. A CMP process may be carried out to remove the excess silicon nitride film 32 outside the recess 127.

Figure 4A:
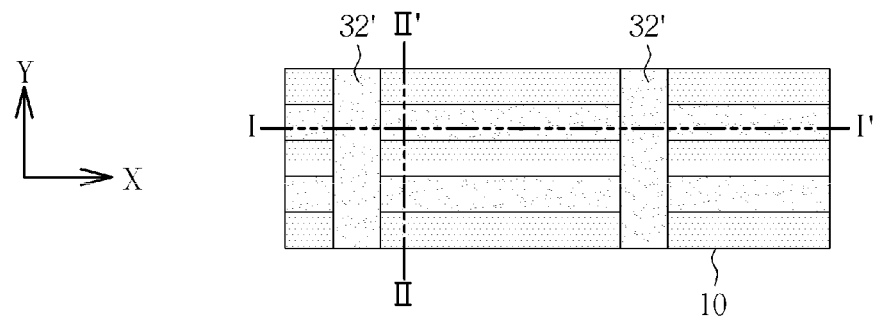
Figure 4B:
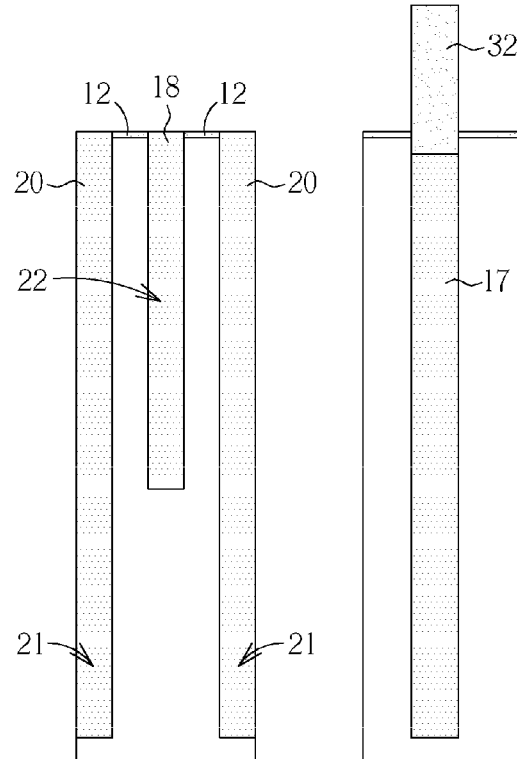
Figure 4C:
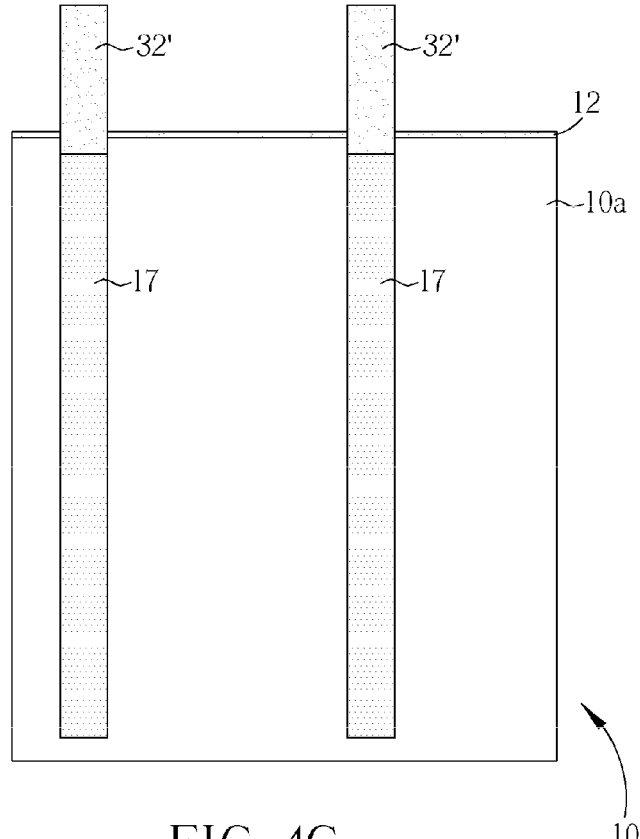

Referring to FIGS. 4A-4C, a wet etching process may be carried out to etch away the sacrificial layer 117, thereby forming line-shaped silicon nitride islands 32'. For example, in the case that the sacrificial layer 117 is made of polysilicon, the wet etching process may include, but not limited to, diluted HF and/or NH4OH (TMAH). After the sacrificial layer 117 is removed, the pad layer 12 is exposed.

Figure 5A:
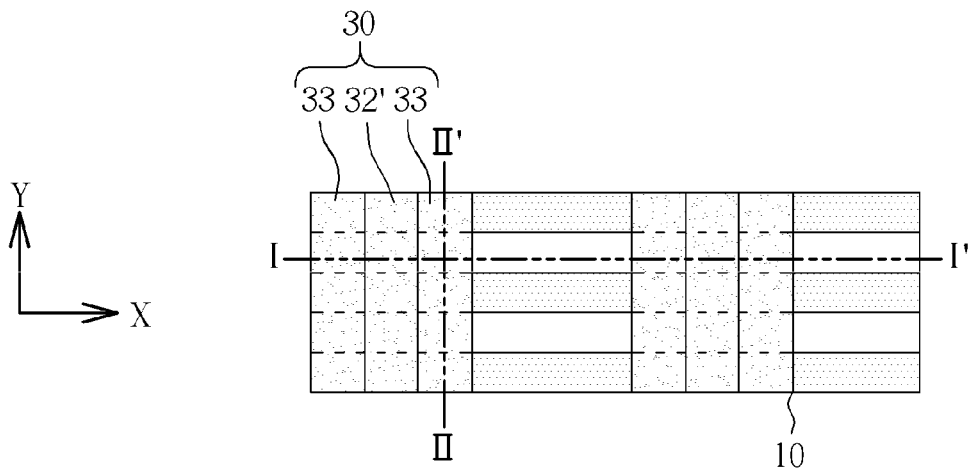
Figures 5B, 5C:
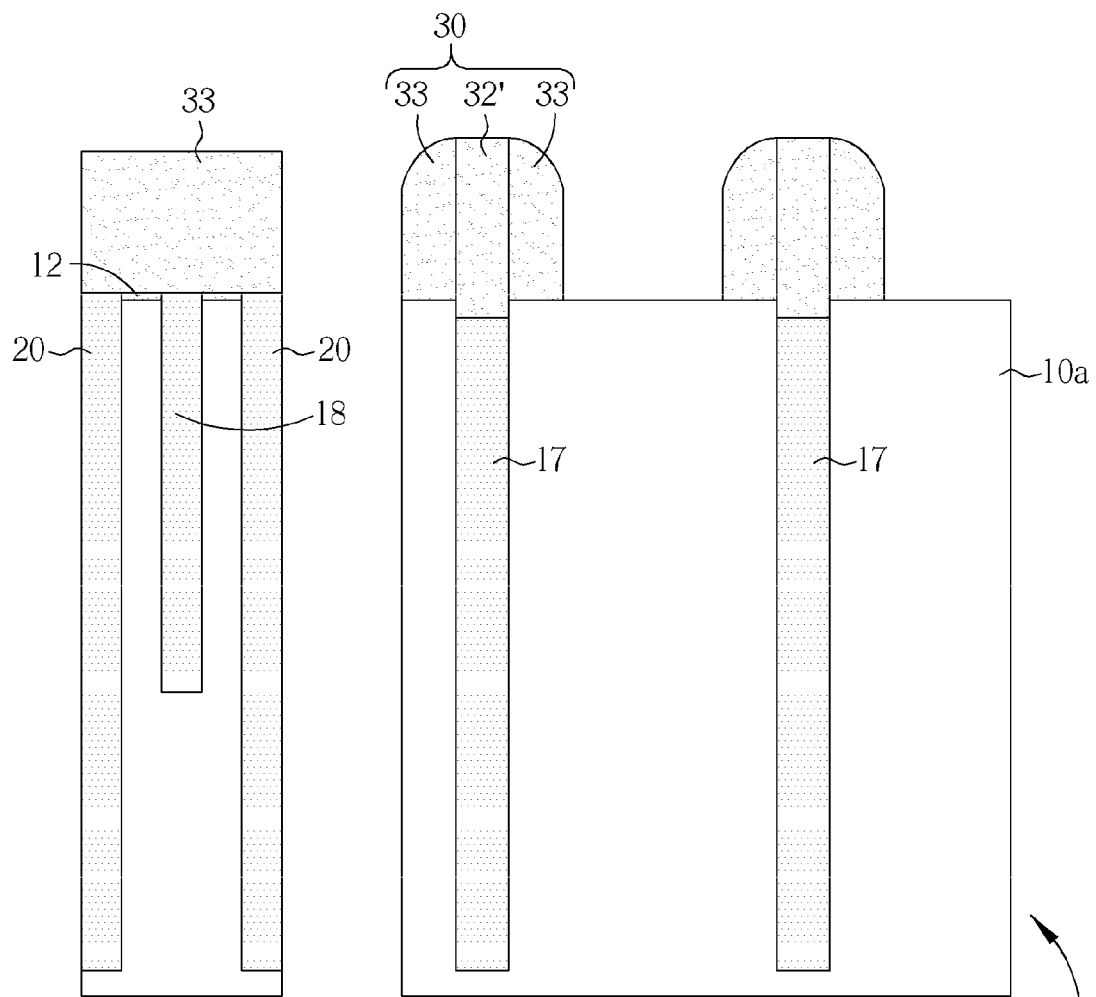

Referring to FIGS. 5A-5C, a spacer 33 such as a silicon nitride spacer is formed on either sidewall of the line-shaped silicon nitride islands 32'. For example, to form the spacer 33, a silicon nitride film having a thickness of about 20 nm is deposited in a blanket manner. An isotropic dry etching process is then performed to etch the silicon nitride film. The pad layer 12 may be etched away to expose a portion of the semiconductor substrate 10. According to the embodiment of the invention, the bottom width of the spacer 33 is about 20 nm, which is substantially identical to the width of the line-shaped silicon nitride islands 32'. The line-shaped silicon nitride islands 32' and the spacers 33 on both sides of the line-shaped silicon nitride islands 32' constitute a self-aligned hard mask pattern 30.

Figure 6A:
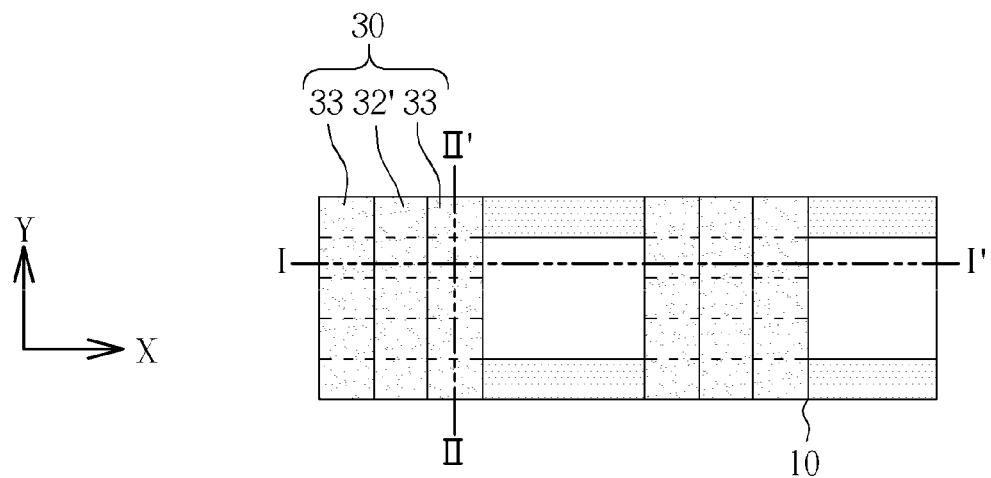
Figures 6B, 6C:
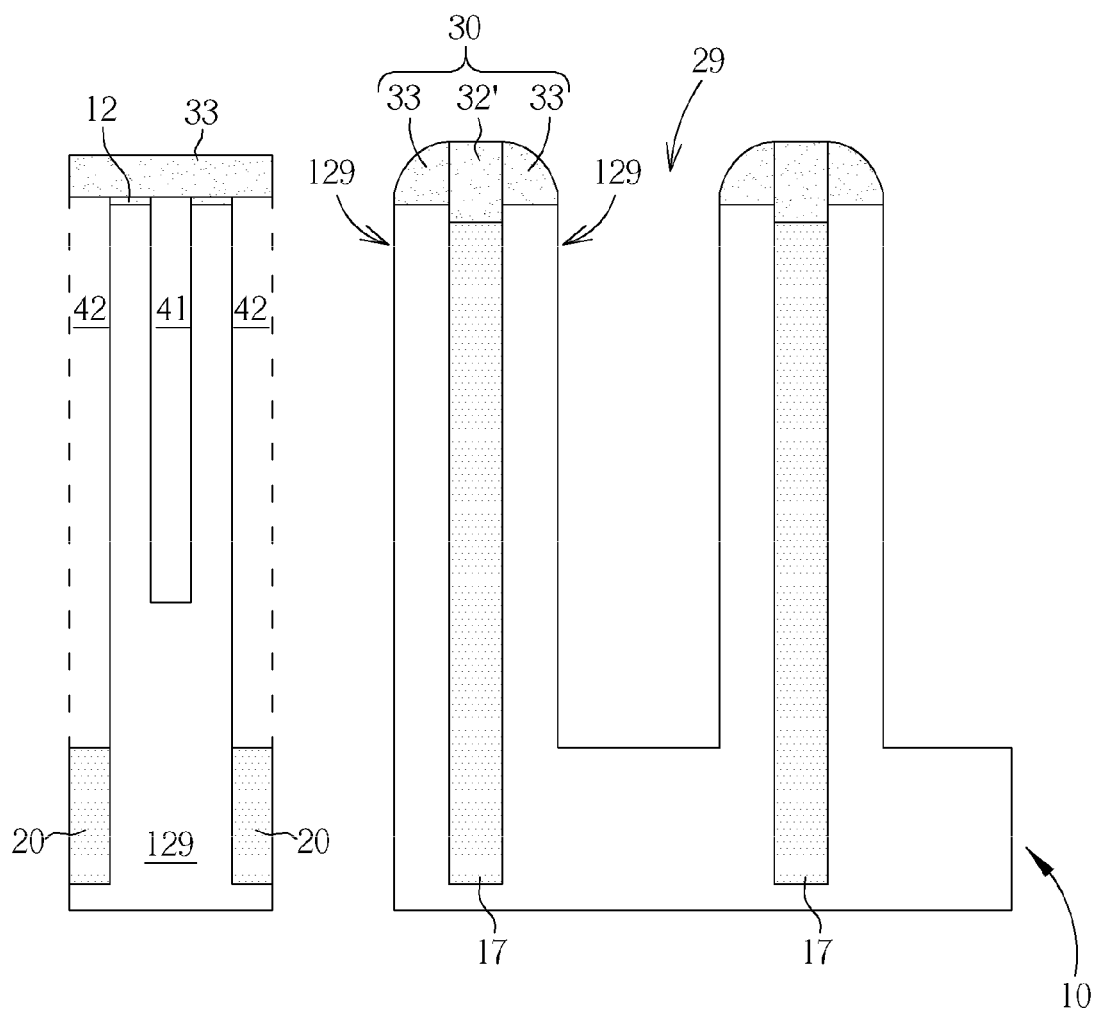
Figure 11:
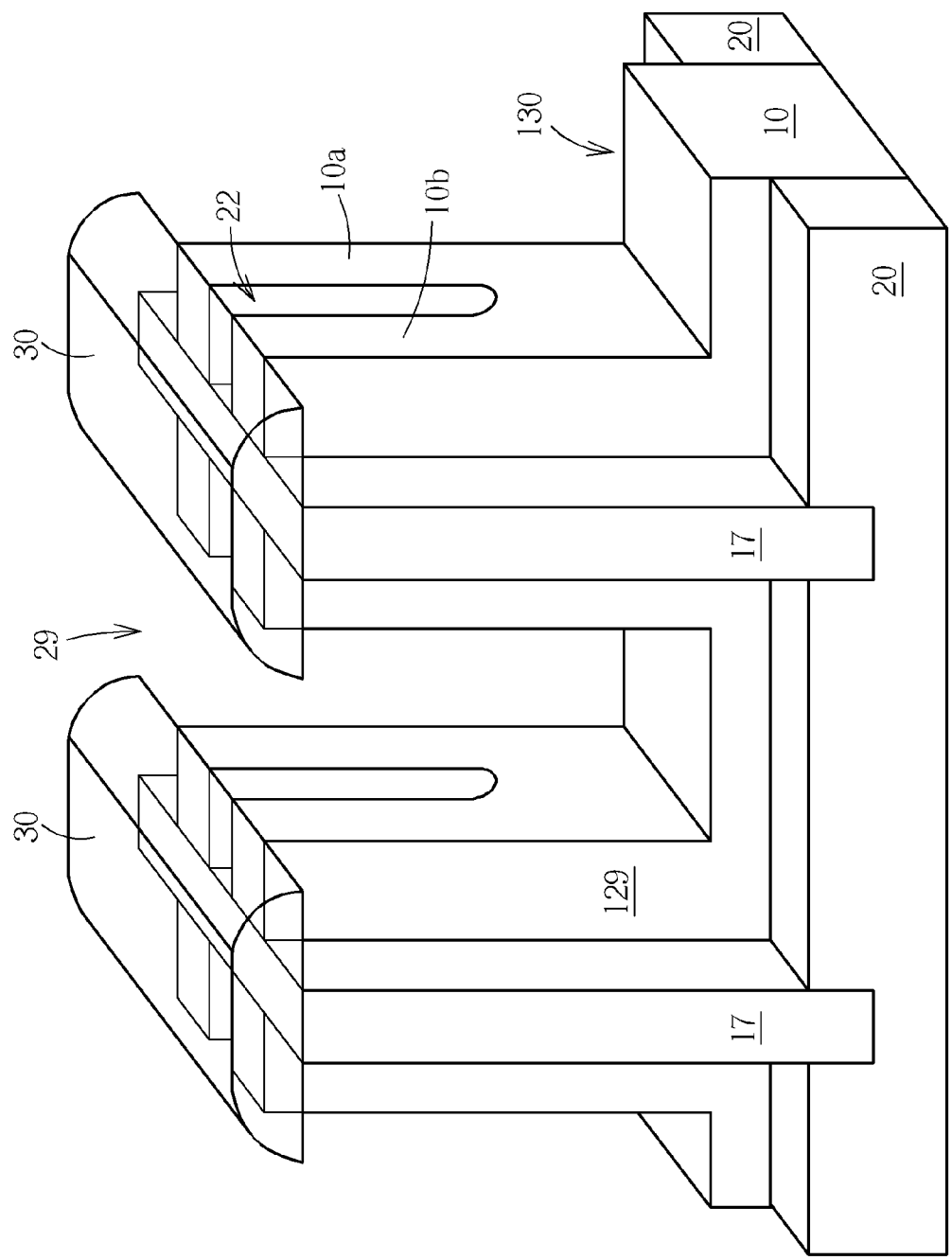
FIG. 11 is a three-dimensional, perspective view of the revealed fin structure after the oxide pull back process.

Referring to FIGS. 6A-6C, using the self-aligned hard mask pattern 30 as an etching hard mask, an anisotropic dry etching process is carried out to etch the exposed semiconductor substrate 10, the line-shaped STI regions 20 and the insulation region 18, thereby forming a trench 29 having a depth of about 200 nm, which is deeper than the insulation region 18 but shallower than the line-shaped STI regions 20. After the anisotropic dry etching process, a tuning-fork-shaped fin structure 129 is formed. Single-sided gates or word lines are to be formed within the trench 29 in the following steps. After the formation of the trench 29, a wet etching process is then performed to laterally pull back the line-shaped STI regions 20 and the insulation region 18 adjacent to the fin structure 129, thereby forming recesses 41 and 42. A three-dimensional, perspective view of the revealed fin structure 129 after the oxide pull back process is shown in FIG. 11. A step height 130 may be formed between the semiconductor substrate 10 and the line-shaped STI regions 20.

Figure 7A:
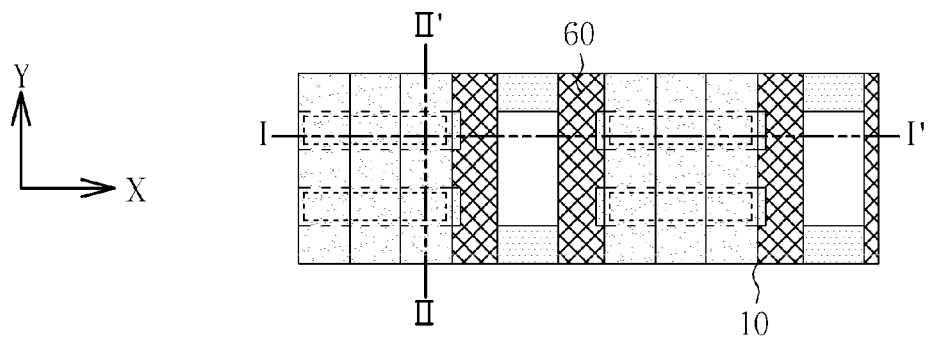
Figures 7B, 7C:
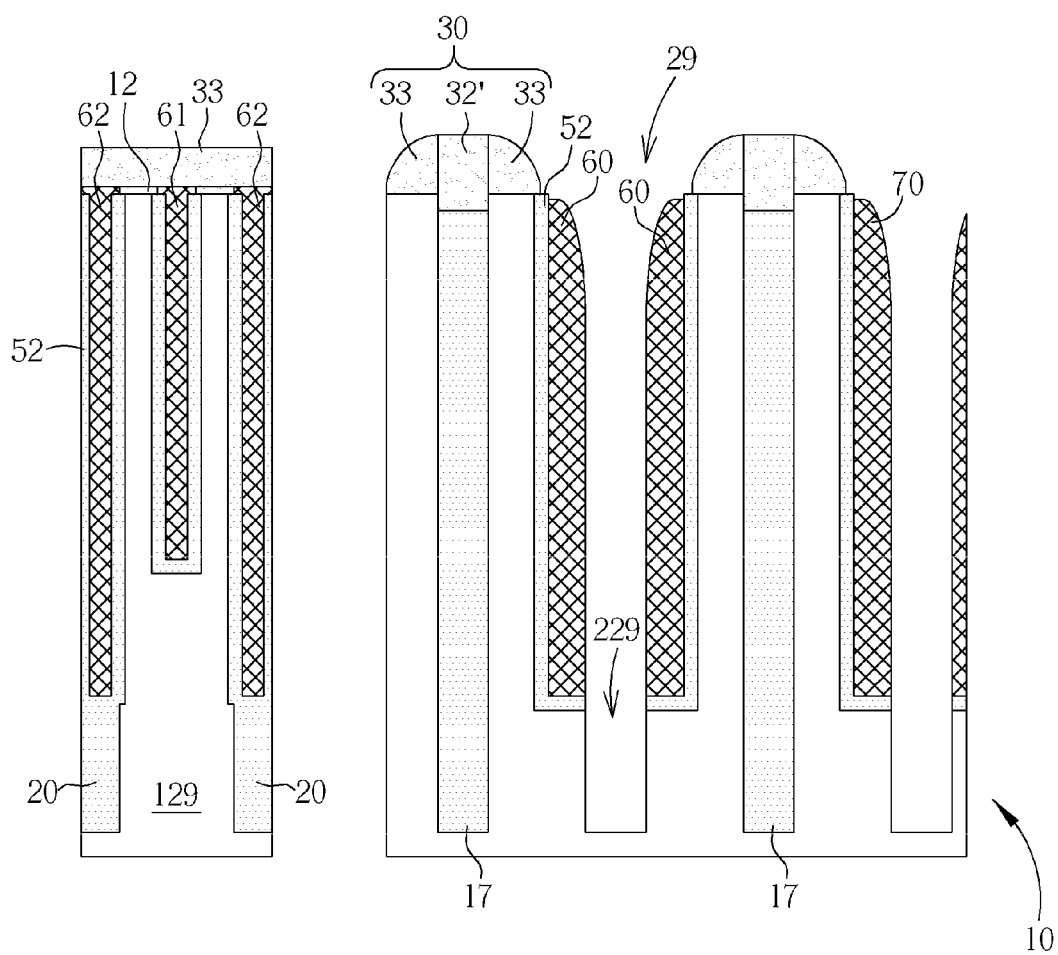

Referring to FIGS. 7A-7C, a thermal oxidation process may be performed to form gate dielectric layer 52 on the exposed surface of the fin structure 129 and the exposed surface of the semiconductor substrate 10. According to the embodiment of the invention, the thickness of the gate dielectric layer 52 may be about 5 nm. Subsequently, a conformal gate material layer such as metal or metal alloys, for example, TiN, is deposited within the trench 29 and into the recesses 41 and 42. The gate material layer is then dry etched to form spacer gate 60 with extension portions 61 and 62 that engage with the fin structure 129. The deposition of the gate material layer may be performed by using conventional CVD or ALD method. Thereafter, a recess 229 is formed at the bottom of the trench 29. The depth of the recess 229 is about 50 nm below the bottom surface of the trench 29.

Figure 8A:
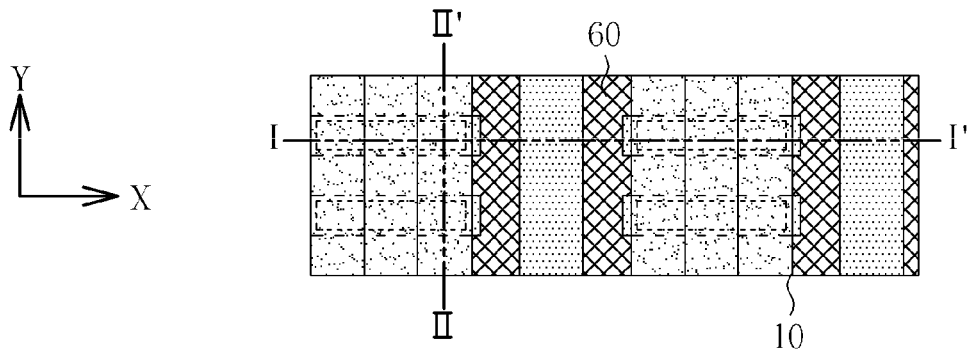
Figure 8B:
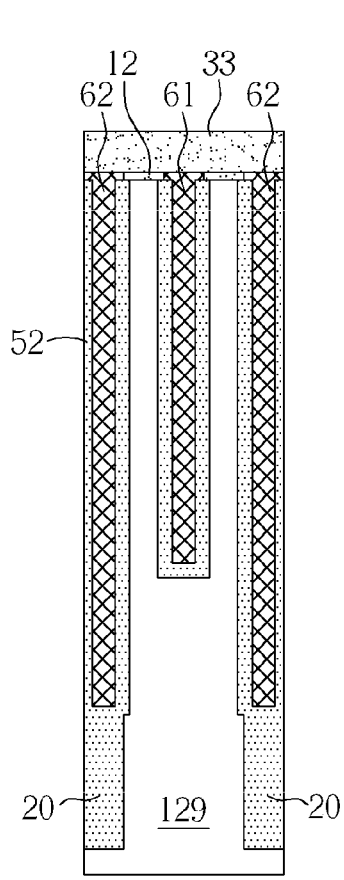
Figure 8C:
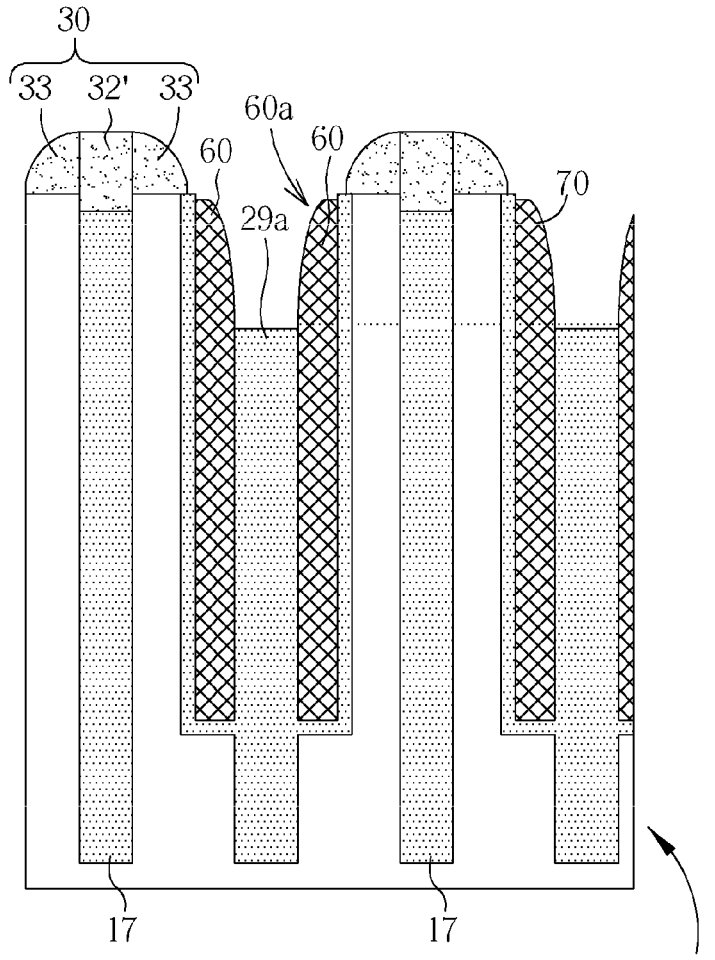

Referring to FIGS. 8A-8C, a first STI oxide fill process is then performed to fill the trench 29 and the recess 229 with oxide filler 29a. A conventional CVD or ALD method may be employed. After the deposition of the oxide filler 29a, a CMP is performed to remove excess oxide filler outside the trench 29. A dry etching process is then performed to etch back the oxide filler 29a to a depth of about 50 nm. A top portion 60a of the spacer gate 60 is exposed.

Figure 9A:
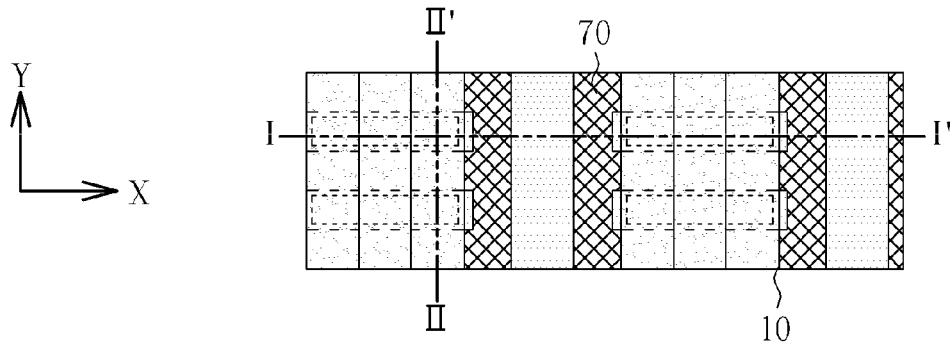
Figure 9B:
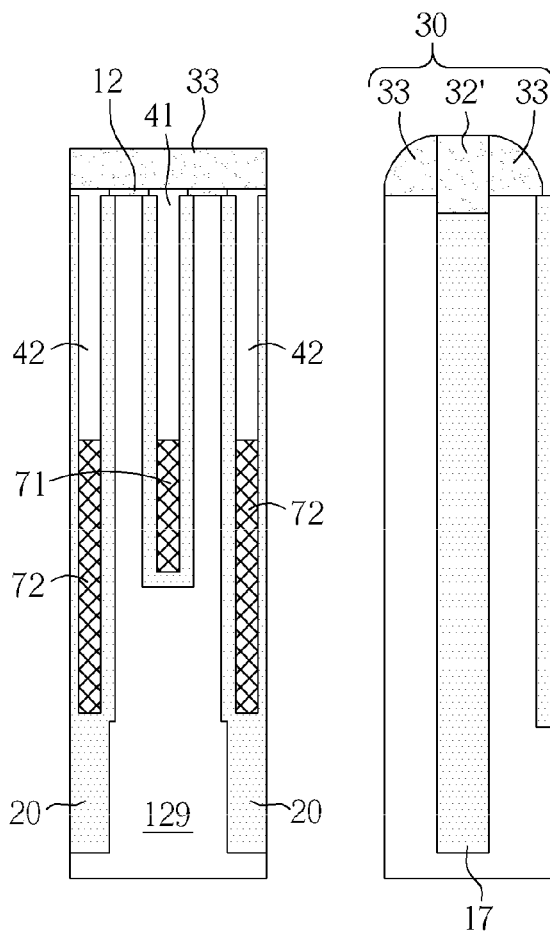
Figure 9C:
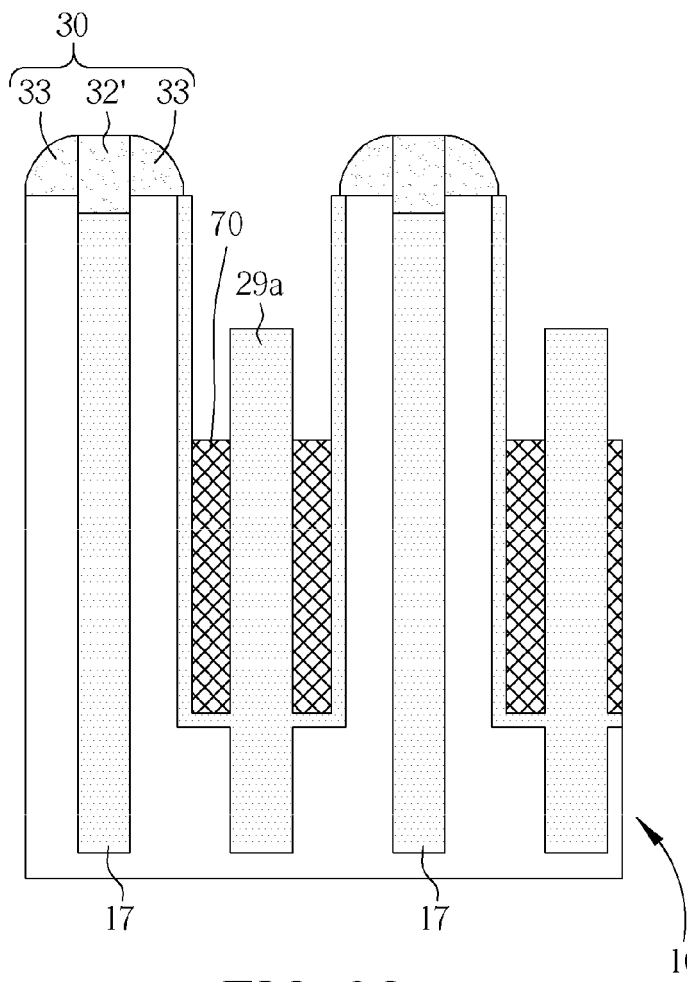

Referring to FIGS. 9A-9C, the top portion 60a of the spacer gate 60 is etched away including parts of the extension portions 61 and 62, thereby forming single-sided gate 70 having multi-fingers 71 and 72 that engage with the fin structure 129. The single-sided gate 70 substantially extends along the reference y-axis direction and the fingers 71 and 72 extend along the reference x-axis direction. The fingers 71 and 72 of the single-sided gate 70 are fittingly inlaid into the fin structure 129. These fingers 71 and 72 increase gate current when operating the fin FET device. According to the embodiment of the invention, the fingers 71 and 72 may be in direct contact with the STI region 17 between two fin structures 129.

Figure 10A:
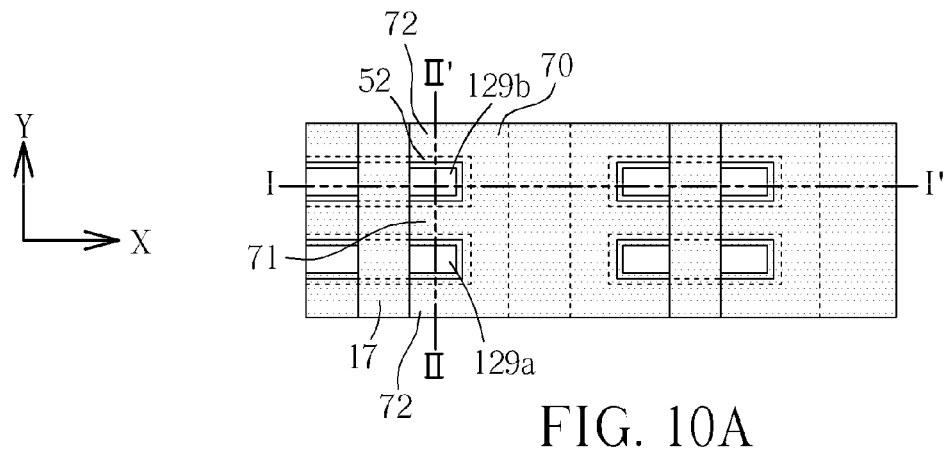
Figures 10B, 10C:
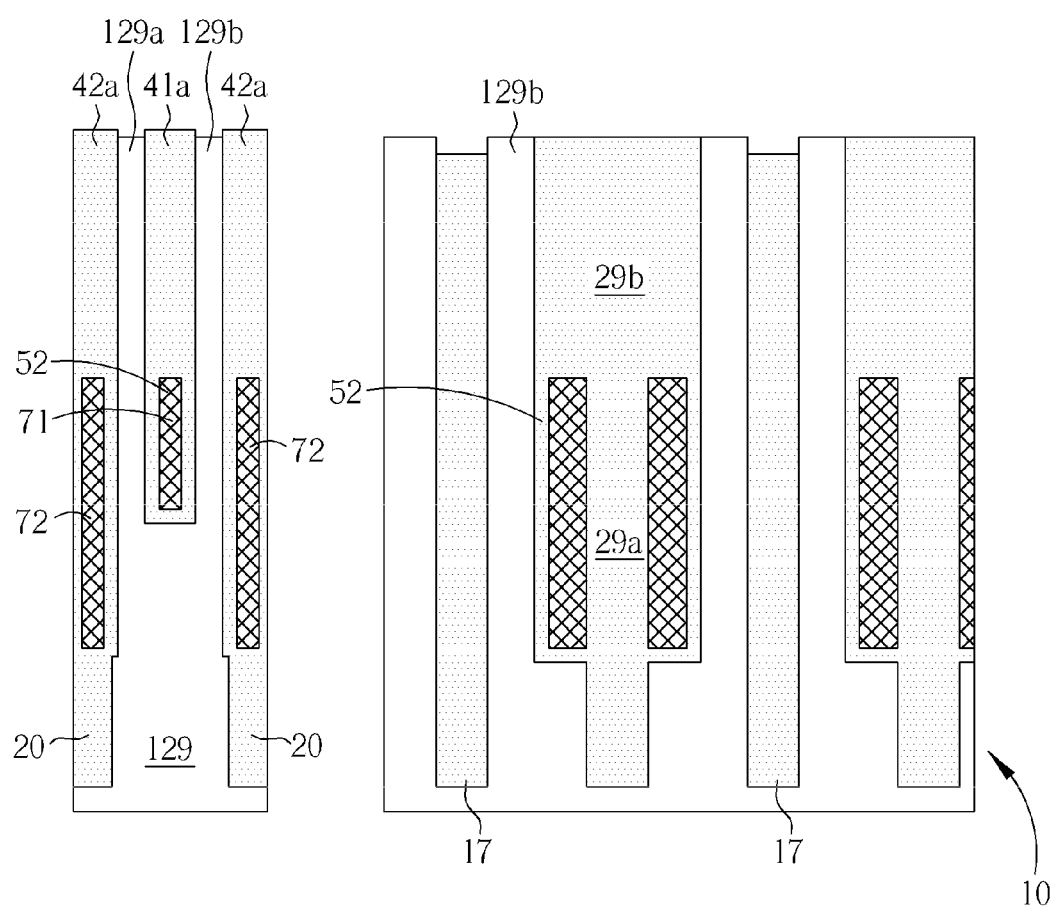

Referring to FIGS. 10A-10C, a second STI oxide fill process is then performed to fill the trench 29 with oxide filler 29b. The oxide filler 29b fills into the recesses 41 and 42 to form isolation regions 41a and 42a. To form the oxide filler 29b, a conventional CVD or ALD method may be employed. The isolation region 41a isolates the source contact area 129a and the drain contact area 129b from each other. After the deposition of the oxide filler 29b, a CMP is performed to remove excess oxide filler outside the trench 29. Subsequently, the self-aligned hard mask pattern 30 is removed. Dopants may be implanted into the source contact area 129a and the drain contact area 129b in a later stage to complete a fin FET transistor.

As shown in FIGS. 10A-10C, the present invention single-sided access device comprises an active fin structure 129 comprising a source contact area 129a and a drain contact area 129b separated from each other by an isolation region 41a disposed therebetween; a first trench isolation structure 17 disposed at one side of the active fin structure 129, wherein the first trench isolation structure 17 intersects with the isolation region 41a; a sidewall gate 70 disposed under the isolation region 41a and on the other side of the active fin structure 129 opposite to the first trench isolation structure 17 so that the active fin structure 129 is sandwiched by the first trench isolation structure 17 and the sidewall gate 70, wherein the sidewall gate 70 has multi-fingers 71 and 72 that engage with the active fin structure 129; and a gate dielectric layer 52 between the sidewall gate 70 and the active fin structure 129.

Those skilled in the art will readily observe that numerous modifications and alterations of the device and method may be made while retaining the teachings of the invention.

What is claimed is:

1. A single-sided access device, comprising:
an active fin structure comprising a source contact area and a drain contact area separated from each other by an isolation region disposed therebetween;
a first trench isolation structure disposed at one side of the active fin structure, wherein the first trench isolation structure intersects with the isolation region;
a sidewall gate disposed under the isolation region and on the other side of the active fin structure opposite to the first trench isolation structure so that the active fin structure is sandwiched by the first trench isolation structure and the sidewall gate, wherein the sidewall gate has multi-fingers that engage with the active fin structure; and
a gate dielectric layer between the sidewall gate and the active fin structure.

2. The single-sided access device according to claim 1 wherein the active fin structure is tuning-fork shaped.

3. The single-sided access device according to claim 1 wherein the sidewall gate comprises a first finger that is situated directly under the isolation region.

4. The single-sided access device according to claim 3 wherein the first finger is in direct contact with the first trench isolation structure.

5. The single-sided access device according to claim 1 further comprising a second trench isolation structure that extends along a direction perpendicular to the first trench isolation structure.

6. The single-sided access device according to claim 5 wherein the sidewall gate comprises a second finger that is directly above the second trench isolation structure.

7. The single-sided access device according to claim 1 wherein the sidewall gate comprises TiN.

* * * * *